United States Patent [19]

Kawamura

[11] Patent Number: 5,173,444
[45] Date of Patent: Dec. 22, 1992

[54] METHOD FOR FORMING A SEMICONDUCTOR DEVICE ISOLATION REGION

[75] Inventor: Akio Kawamura, Nara, Japan

[73] Assignee: Sharp Kabushiki Kaisha, Osaka, Japan

[21] Appl. No.: 760,131

[22] Filed: Sep. 16, 1991

[30] Foreign Application Priority Data

Sep. 18, 1990 [JP] Japan .................. 2-249724

[51] Int. Cl.$^5$ ......................................... H01L 21/76
[52] U.S. Cl. .................................. 437/69; 437/72
[58] Field of Search .............................. 437/69, 72; 148/DIG. 85, DIG. 86

[56] References Cited

FOREIGN PATENT DOCUMENTS 56-164550 12/1981 Japan ..................................... 437/69
63-152155  6/1988 Japan ..................................... 437/73
 2-10729  1/1990 Japan ..................................... 437/69

OTHER PUBLICATIONS

Wolf, S., et al., *Silicon Processing for the VLSI Era vol. 2 Process Integration*, pp. 43–44, 1990.

*Primary Examiner*—Olik Chaudhuri
*Assistant Examiner*—G. Fourson
*Attorney, Agent, or Firm*—Nixon & Vanderhye

[57] ABSTRACT

A method for forming a semiconductor device isolation region including steps of forming a first silicon oxide film on a silicon substrate, depositing a first silicon nitride film over the first silicon oxide film, and removing the first silicon oxide film and first silicon nitride film in a device isolation region by using a resist pattern, which is formed by a one-time photolithographic step, as a mask so as to expose the surface of the silicon substrate, removing the resist pattern, and oxidizing the exposed surface of the silicon substrate so as to form a second silicon oxide film having a smaller thickness than the first silicon oxide film and to deposit a second silicon nitride film, removing the second silicon nitride film by anisotropic etching until the second silicon oxide film is exposed in the device isolation region so as to make the second silicon nitride film remain as the side wall portion of the silicon nitride film in only the opening side wall portion of the first silicon nitride film, etching the second silicon oxide film in the opening of the first silicon nitride film on a self-aligning basis by using as etching masks the first silicon nitride film and the side wall portion of the second silicon nitride film remaining on the opening side wall portion of the first silicon nitride film, and selectively carrying out oxidation so as to form a thick silicon oxide film in the device isolation region.

4 Claims, 3 Drawing Sheets

FIG.2 (a) (Prior Art)

METHOD FOR FORMING A SEMICONDUCTOR DEVICE ISOLATION REGION

BACKGROUND OF THE INVENTION

1. Field of the Invention

The present invention relates to a method for forming a semiconductor device isolation region to electrically isolate devices constituting a semiconductor integrated circuit on a silicon substrate.

2. Description of the Prior Art

There has been an increase in the capacity of VLSI (Very Large Scale Integrated Circuits) such as a DRAM (Dynamic Random Access Memory) or a SRAM (Static Random Access Memory) by four times every three years. At present, the DRAM which is mainly manufactured has the capacities of 256 Kb and 1 Mb. It is contemplated that DRAM's having the capacities of 4 Mb and 16 Mb which will be the mainstream in the future. Probably, there will be developed the DRAM having the capacities of 64 Mb and 256 Mb.

The device constituting an integrated circuit is made fine, so that integration can be improved in a limited chip area as described above. By way of example, the minimum dimension of a MOS transistor used in the 1 Mb DRAM is about 1 $\mu$m. In the future, the above-mentioned minimum dimension will surely be reduced to 0.5 $\mu$m and further to 0.25 $\mu$m. Similarly, it is required to reduce a device isolation region for higher integration. In addition, it is necessary to reduce an isolation width from 1 $\mu$m to about 0.5 $\mu$m.

In general, the device isolation region is formed by a selective oxidation process. FIG. 2 shows the prior art in which the device isolation region is formed by the selective oxidation process. There will be described the conventional selective oxidation process with reference to FIGS. 2(a)-(d).

(1) As shown in FIG. 2 (a), the surface of a silicon substrate 21 is thinly oxidized to form a silicon oxide film 22 having a thickness of 100 to 700 Å. Then, a silicon nitride film 23 having a thickness of 1000 to 2000 Å is deposited over the silicon oxide film 22 by LPCVD (Low-Pressure Chemical Vapor Deposition). Then, a resist pattern 24 is formed to define an active region and a device isolation region constituting a semiconductor device. A region K covered by the resist pattern 24 is the active region. An opening 25 of the resist pattern 24 is a device isolation region S.

(2) The silicon oxide film 22 and silicon nitride film 23 in the opening 25 of the resist pattern 24 are etched by using the resist pattern 24 as an etching mask. Then, the resist pattern 24 is removed [see FIG. 2 (b)].

(3) When silicon is oxidized by a thermal oxidation process, oxygen is supplied to the exposed surface of the silicon substrate 21 through the opening 25 so as to oxidize the surface of the silicon substrate 21. Consequently, a silicon oxide film 26 is formed. In the active region K, the surface of the silicon substrate 21 is covered by the silicon nitride film 23. Consequently, oxygen is not supplied to the silicon substrate 21, so that the silicon oxide film is not grown. In the vicinity of the opening 25, the oxygen is diffused through the thin silicon oxide film 22. Consequently, the silicon substrate 21 is oxidized. In addition, the silicon oxide film 26 is widely grown so as to push up the silicon nitride film 23 in the direction of an arrow A. The silicon oxide film 26 is extended below the silicon nitride film 23 so as to form a region 27 having a length of d. The region 27 is generally called a bird's beak [see FIG. 2 (c)].

(4) The silicon nitride film 23 is removed by a heated phosphoric acid solution. Then, the silicon oxide film 22 is removed by a diluted hydrofluoric acid solution. Thus, there is completed device isolation steps by the selective oxidation process [see FIG. 2 (d)].

Then, the semiconductor device such as a transistor is formed in the region 27 in which the surface of the silicon substrate 21 is exposed. The semiconductor devices are electrically isolated from each other by the silicon oxide film 26.

As described above, the device isolation region can be formed very easily by the selective oxidation process. Therefore, the selective oxidation process has widely been used as the device isolation technique of the semiconductor device.

However, it is required to reduce the device isolation region for the high integration of the semiconductor integrated circuit. In addition, it is necessary to reduce an isolation width from 1 $\mu$m to about 0.5 $\mu$m. The selective oxidation process has the following problems with respect to the reduction of the device isolation region. Consequently, it is difficult to use the selective oxidation process as the device isolation technique of the semiconductor integrated circuit having the higher integration.

Referring to the selective oxidation process in FIG. 2 (c), the thick silicon oxide film 26 for electrically isolating the devices is grown in the opening 25 of the silicon nitride film 23 as the device isolation region S. In addition, the intrusion of the silicon oxide film 26, which is a bird's beak 27, is generated in the active region K covered by the silicon nitride film 23. The bird's beak 27 has a width of d. Consequently, the isolation region is enlarged by a width of 2d on its both sides. On the other hand, the active region K is reduced by 2d. By way of example, if the width d is 0.3 $\mu$m and the minimum pattern opening width is 0.4 $\mu$m in a photolithographic step, the device isolation region is enlarged by 0.6 $\mu$m on its both sides. Consequently, the formable minimum isolation width is 1.0 $\mu$m. At present, there is required the device isolation region having a width which is a little less than 0.5 $\mu$m as described above. Consequently, it is more difficult to form the device isolation region by the selective oxidation process.

It is an object of the present invention to provide a method for forming a semiconductor device isolation region corresponding to its fineness which is required with the high integration of a semiconductor integrated circuit.

SUMMARY OF THE INVENTION

The present invention provides a method for forming a semiconductor device isolation region comprising steps of forming a first silicon oxide film on a silicon substrate, depositing a first silicon nitride film over the first silicon oxide film, and removing the first silicon oxide film and first silicon nitride film in a device isolation region by using a resist pattern, which is formed by a one-time photolithographic step, as a mask so as to expose the surface of the silicon substrate, removing the resist pattern, and oxidizing the exposed surface of the silicon substrate so as to form a second silicon oxide film having a smaller thickness than the first silicon oxide film and to deposit a second silicon nitride film, removing the second silicon nitride film by anisotropic etching until the second silicon oxide film is exposed in the device isolation region so as to make the second silicon nitride film remain as the side wall portion of the silicon nitride film in only the opening side wall portion of the first silicon nitride film, etching the second silicon oxide film in the opening of the first silicon nitride film on a self-aligning basis by using as etching masks the first silicon nitride film and the side wall portion of the second silicon nitride film remaining on the opening side wall portion of the first silicon nitride film, and selectively carrying out oxidation so as to form a thick silicon oxide film in the device isolation region.

BRIEF DESCRIPTION OF THE DRAWINGS

FIGS. 2(a)-(d) are views showing manufacturing steps by a selective oxidation process as a device isolation method according to the prior art.

DETAILED DESCRIPTION OF A PREFERRED EMBODIMENT

The present invention is characterized in that the opening side wall portion of a first silicon nitride film is provided with an offset which is formed by a thin silicon oxide film and a second silicon nitride film. Consequently, the fineness of a device isolation region can be realized.

According to a method of the present invention, the device isolation region can be prevented from being enlarged owing to a bird's beak by a conventional selective oxidation process, i.e., the so-called intrusion of the bird's beak can be controlled. Consequently, the silicon oxide film can almost surely be formed in the device isolation region which is defined in a photolithographic step. Thus, the fine device isolation region can be formed to greatly contribute to the fineness of a semiconductor integrated circuit.

Furthermore, the method of the present invention can be realized by only adding a number of steps to the conventional selective oxidation process. Consequently, there is comparatively slight the increase of manufacturing costs along with that of the number of steps.

A preferred embodiment of the present invention will be described in more detail with reference to the drawings. The present invention is not limited to the following embodiment.

Figure 1A:
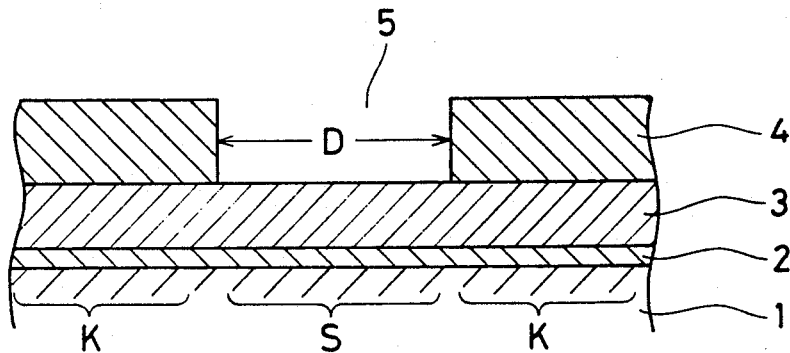
FIGS. 1(a)-(h) are views showing steps of forming a device isolation region on a silicon substrate according to an embodiment of the present invention.
Figure 1B:
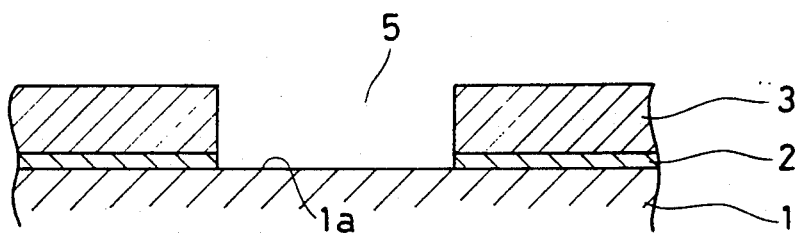
Figure 1C:
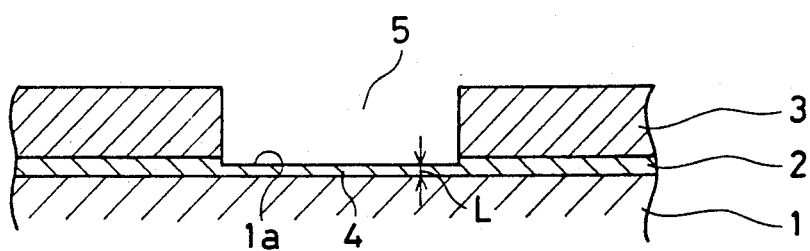
Figure 1D:
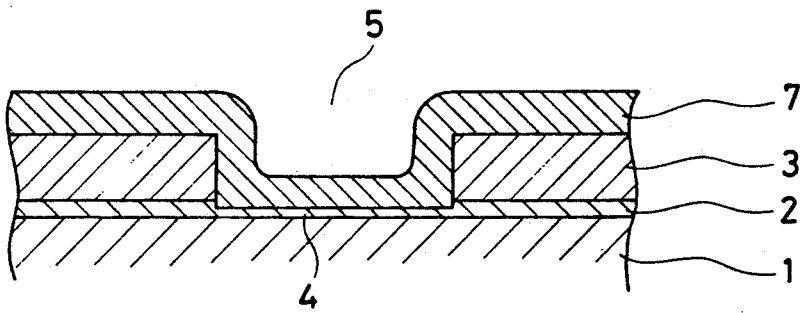
Figure 1E:
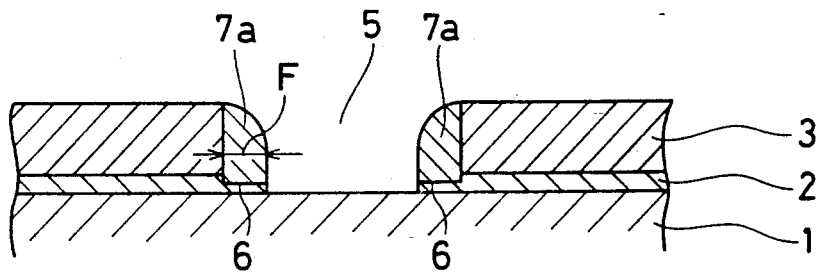
Figure 1F:
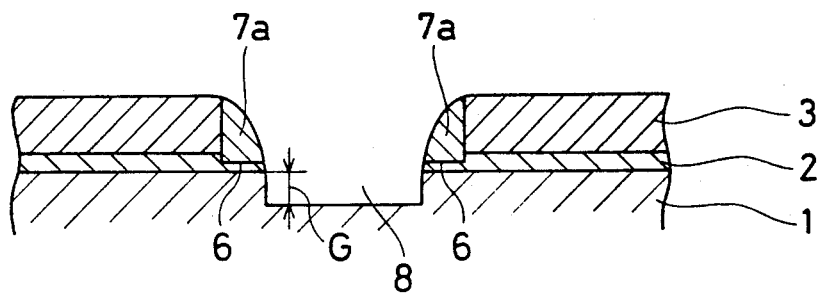
Figure 1G:
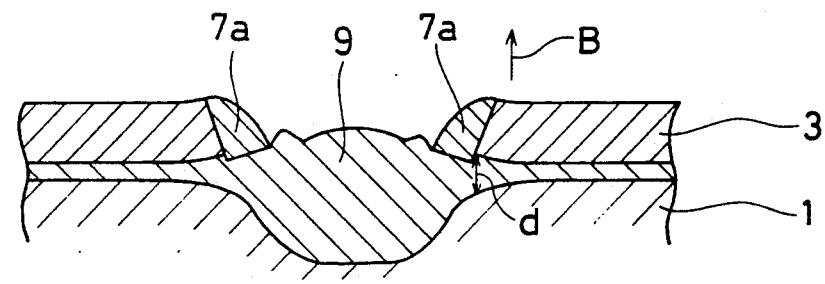
Figure 1H:
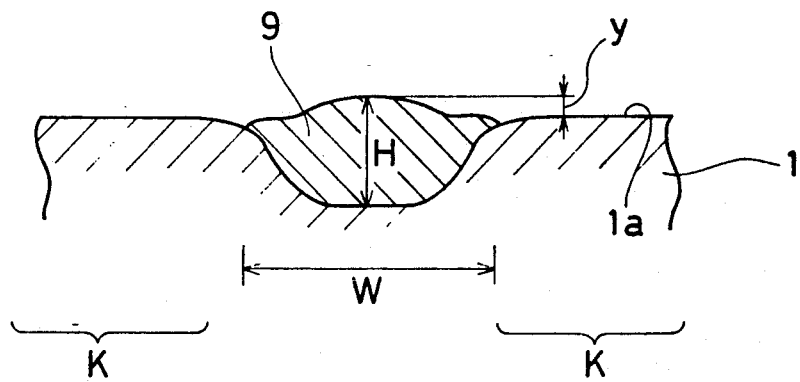

FIGS. 1 (a) to (h) show the state in which a device isolation region is formed by a method according to an embodiment of the present invention. There will be described a method for forming a semiconductor device isolation region according to the embodiment of the present invention with reference to FIGS. 1 (a) to (h).

(i) As shown in FIG. 1 (a), the surface of a silicon substrate 1 is thinly oxidized to form a first silicon oxide film 2 having a thickness of 100 to 500 Å. Then, a first silicon nitride film 3 is deposited over the first silicon oxide film 2 at a thickness of 1000 to 2000 Å by LPCVD. Thereafter, a resist pattern 4 for defining the isolation region is formed in a photolithographic step. With the resist pattern 4 thus formed, a device isolation region S is defined by an opening 5 having a width D of 0.4 μm as shown in FIG. 1 (a). The surface of the silicon substrate 1 in the region covered by the resist pattern 4 is an active region K on which a semiconductor device is formed.

(ii) As shown in FIG. 1 (b), the first silicon nitride film 3 is processed using the resist pattern 4 as an etching mask by RIE (Reactive Ion Etching). Then, the resist pattern 4 is removed. The first silicon oxide film 2 exposed in the opening 5 is removed by a diluted hydrofluoric acid solution. Consequently, there is exposed a surface 1a of the silicon substrate 1 on which the isolation region is formed.

(iii) As shown in FIG. 1 (c), the surface 1a of the silicon substrate 1 exposed in the opening 5 is thinly oxidized to form a second silicon oxide film 4. It is necessary to make a thickness L of the second silicon oxide film 4 be smaller than that of the first silicon oxide film 2. According to the present embodiment, the thickness L is 80 Å.

(iv) As shown in FIG. 1 (d), a second silicon nitride film 7 having a thickness of 500 to 1000 Å is deposited over the whole surface by LPCVD.

(v) As shown in FIG. 1 (e), the second silicon nitride film 7 is anisotropically etched by RIE until the second silicon oxide film 4 is exposed in the opening 5. Then, the second silicon oxide film 4 thus exposed is removed by the diluted hydrofluoric acid solution. The residual second silicon oxide film is indicated at 6. As a result, the second silicon nitride film 7 remains only in the stage difference side wall portions of the first silicon nitride film 3. The residual second silicon nitride film 7 is a side wall portion 7a. A width F of the side wall portion 7a is equal to the thickness of the second silicon nitride film 7 which is deposited, and is 500 to 1000 Å.

(vi) As shown in FIG. 1 (f), a trench 8 having a depth G of 500 to 2000 Å is formed on the silicon substrate 1 on a self-aligning basis by using as etching masks the first silicon nitride film 3 and the side wall portion 7a of the second silicon nitride film which remains on the stage difference side wall portion of the opening 5.

While the second silicon nitride film 7, second silicon oxide film 6 and trench 8 are separately etched in the steps shown in FIGS. 1 (d) to (f) in the present embodiment, they may be etched in the same step.

(vii) As shown in FIG. 1 (g), when thermal oxidation is carried out, a silicon oxide film 9 is grown in the trench 8 in which the silicon substrate 1 is exposed. In this case, oxygen is not supplied to the surface of the silicon substrate 1 covered by the first silicon nitride film 3 at the time of oxidation. Consequently, the silicon oxide film is not grown. The thin second silicon oxide film 6 is provided just below the side wall portion 7a of the second silicon nitride film. The silicon oxide film is grown so as to push up the second silicon nitride film 7a in the direction of an arrow B by using the second silicon oxide film 6 as an oxygen supply passageway. Since the second silicon oxide film 6 is very thin, a lot of oxygen is not supplied. In addition, the second silicon oxide film 6 is pressed by the first and second silicon nitride films 3 and 7, so that the intrusion of a bird's beak can be made much smaller than in a conventional selective oxidation process.

The intrusion of the bird's beak causes a thin silicon oxide film to be grown in the pattern end of the first silicon nitride film 3 which is the boundary of the device isolation region. A thickness d of the silicon oxide film is almost equal to the decrease of the silicon oxide film 9 from the completion of the device isolation step to a step of forming a gate insulating film. The thickness d is about 500 to 1000 Å. The silicon oxide film 9 is grown at the rate of about 1:1 around the silicon surface before oxidation. According to the present embodiment, the trench 8 is formed before oxidation. Consequently, the surface of the silicon oxide film 9 can be made comparatively smooth relative to the surface of the silicon substrate 1. On the other hand, there is increased the rate of the silicon oxide film 9 which is grown on the silicon substrate 1 side. Consequently, there can effectively be increased the distance between the semiconductor devices which are formed in the active regions on both sides of the silicon oxide film 9. Consequently, device isolation characteristics can be improved.

Figure 2B:
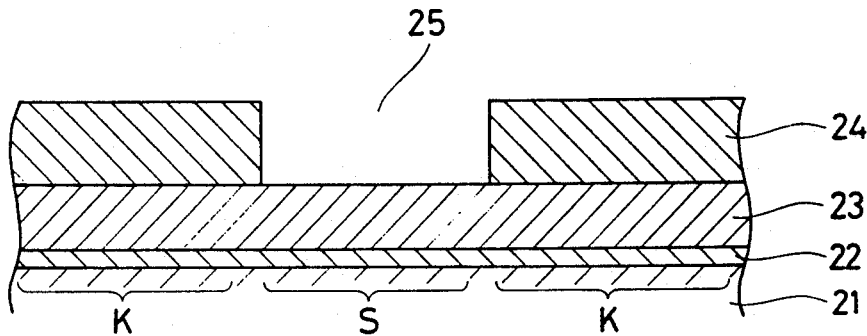
Figure 2B:
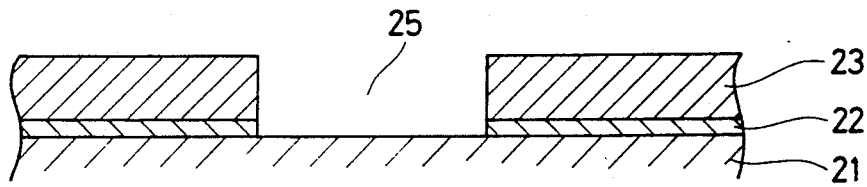
Figure 2C:
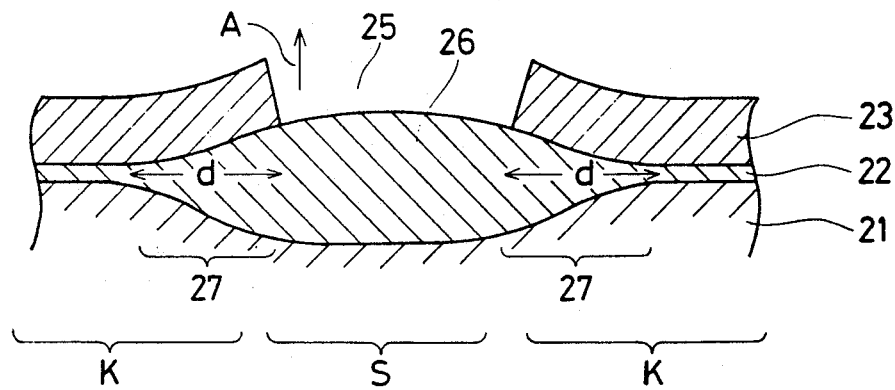
Figure 2D:
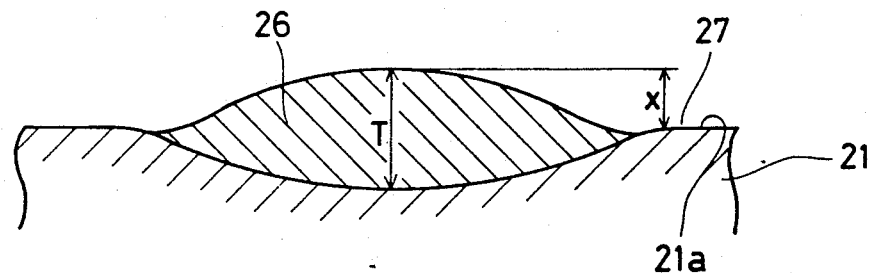

(viii) The first and second silicon nitride films 3 and 7 are removed by thermal phosphoric acid. Then, the first silicon oxide film 2 is removed by the diluted hydrofluoric acid solution. Consequently, there can be obtained a structure shown in FIG. 1 (h). Thus, a series of steps of forming a device isolation region are completed. Then, a gate insulating film (not shown) is formed in the active region in which the surface of the silicon substrate 1 is exposed. As described above, the decrease of the thickness of the silicon oxide film 9 is equal to the thickness d of the silicon oxide film in the pattern end of the first silicon nitride film 3 [see FIG. 1 (g)]. Consequently, a width W of the silicon oxide film 9 as the device isolation region is equal to the width D of the opening 5 of the resist pattern 4 which defines the device isolation region in FIG. 1 (a) (W=D). A maximum thickness H of the silicon oxide film 9 is about 0.5 μm. Even if a maximum thickness T of a silicon oxide film 26 shown in FIG. 2 (d) is about 0.5 μm, a distance y between the surface 1a of the silicon substrate 1 and the top of the silicon oxide film 9 is smaller by 20 to 40% than a distance x between a surface 21a of a silicon substrate 21 and the top of the silicon oxide film 26. Consequently, there can be reduced the stage difference owing to the silicon oxide film.

The device isolation region is formed in the above-mentioned steps. Then, the semiconductor devices such as MOS transistors or capacitors are formed in normal steps. Consequently, a semiconductor integrated circuit can be obtained.

The MOS transistor thus formed is measured. As a result, it is found that the MOS transistors are not inferior to transistors which are isolated by the conventional selective oxidation process and have the same size. There cannot be formed by the conventional selective oxidation process MOS transistors having a very small channel width of 0.4 μm because of the spreading of the bird's beak. Also in these MOS transistors, good characteristics can be obtained. In the case where the distance between adjacent devices is 0.4 μm, there can be obtained very good device isolation characteristics that both a field punchthrough characteristic and a field inverted voltage are 10 V or more.

The present invention relates to a method for forming a semiconductor device isolation region. Materials, means, numeric values and the like are not limited to those of the present embodiment except for Claims.

According to the method for forming a semiconductor device isolation region of the present invention, it is possible to extremely control the intrusion of the bird's beak in the active region of the silicon oxide film formed in the isolation region. Consequently, the active region and isolation region can easily be made finer. Accordingly, the present invention can greatly contribute to the high integration of the semiconductor integrated circuit. Referring to the steps of forming a device isolation region, it is sufficient that a number of steps are added to the conventional selective oxidation process. Thus, manufacturing costs can be reduced.

What is claimed is:

1. A method for forming a semiconductor device isolation region, comprising steps of:

forming a first silicon oxide film on a silicon substrate, depositing a first silicon nitride film over the first silicon oxide film, and removing the first silicon oxide film and first silicon nitride film in a device isolation region to form an opening in said films by using a resist pattern, which is formed photolithographically as a mask so as to expose the surface of the silicon substrate, removing the resist pattern, and oxidizing the exposed surface of the silicon substrate so as to form a second silicon oxide film having a smaller thickness than the first silicon oxide film and depositing a second silicon nitride film, removing the second silicon nitride film by anisotropic etching until the second silicon oxide film is exposed in the device isolation region so as to make the second silicon nitride film remain as a side wall portion of the first silicon nitride film in only the side wall portion of said opening in the first silicon nitride film, etching the second silicon oxide film in the opening of the first silicon nitride film on a self-aligning basis by using as etching masks the first silicon nitride film and the side wall portion of the second silicon nitride film remaining on the opening side wall portion of the first silicon nitride film, and selectively carrying out oxidation so as to form a silicon oxide film in the device isolation region.

2. A method for forming a semiconductor device isolation region according to claim 1, wherein the silicon substrate is also etched to form a trench when etching the second silicon oxide film.

3. A method for forming a semiconductor device isolation region according to claim 2, wherein the trench of the silicon substrate has a depth of 500 to 2000 Å.

4. A method of forming a semiconductor device isolation region according to claim 1 wherein said device isolation region is formed to have a width of 0.5 μm or less; and the first silicon oxide film, the first silicon nitride film and the second silicon nitride film are formed so as to be 100-500 Å thick, 1000-2000 Å thick and 500-1000 Å thick, respectively.

* * * * *